United States Patent
Cao et al.

(10) Patent No.: US 9,536,476 B2
(45) Date of Patent: Jan. 3, 2017

(54) GATE DRIVER CIRCUIT, GATE DRIVING METHOD, GATE-ON-ARRAY CIRCUIT, DISPLAY DEVICE, AND ELECTRONIC PRODUCT

(71) Applicant: BOE TECHNOLOGY GROUP CO., LTD., Beijing (CN)

(72) Inventors: Kun Cao, Beijing (CN); Zhongyuan Wu, Beijing (CN); Liye Duan, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/415,529

(22) PCT Filed: Apr. 25, 2014

(86) PCT No.: PCT/CN2014/076261
§ 371 (c)(1),
(2) Date: Jan. 16, 2015

(87) PCT Pub. No.: WO2015/096330
PCT Pub. Date: Jul. 2, 2015

(65) Prior Publication Data
US 2016/0042693 A1    Feb. 11, 2016

(30) Foreign Application Priority Data
Dec. 24, 2013 (CN) .......................... 2013 1 0722407

(51) Int. Cl.
*G09G 3/32*      (2016.01)
*G11C 19/28*     (2006.01)

(52) U.S. Cl.
CPC .......... *G09G 3/3291* (2013.01); *G09G 3/3258* (2013.01); *G09G 3/3266* (2013.01);
(Continued)

(58) Field of Classification Search
CPC .................................................... G09G 3/3266
See application file for complete search history.

(56) References Cited

U.S. PATENT DOCUMENTS 7,382,347 B2   6/2008   Sasaki et al.
7,605,789 B2   10/2009  Uchino et al.
(Continued)

FOREIGN PATENT DOCUMENTS

CN        1684558 A      10/2005
CN      101097677 A       1/2008
(Continued)

OTHER PUBLICATIONS

Written Opinion of the International Searching Authority for international application No. PCT/CN2014/076261. English translation provided by Dragon Intellectual Property Law Firm.
(Continued)

*Primary Examiner* — Sanjiv D Patel
(74) *Attorney, Agent, or Firm* — Harness, Dickey & Pierce, P.L.C.

(57) ABSTRACT

The gate driver circuit is connected to a row of pixel unit, each includes a pixel driving module and a light-emitting device connected to each other, the pixel driving module including a driving transistor, a driving module and a compensating module, the compensating module is connected to a first row scanning signal, and the driving module is connected to a second row scanning signal and a driving voltage. The gate driver circuit further includes a row pixel controlling unit configured to provide the first row scanning signal to the compensating module and provide the second row scanning signal and the driving voltage to the driving module, so as to control the compensating module to compensate for a threshold voltage of the driving transistor and control the driving module to drive the light-emitting device.

18 Claims, 5 Drawing Sheets

(52) U.S. Cl.
CPC ............ *G11C 19/28* (2013.01); *G09G 3/3233* (2013.01); *G09G 2300/043* (2013.01); *G09G 2300/0819* (2013.01); *G09G 2300/0861* (2013.01); *G09G 2300/0866* (2013.01); *G09G 2310/0286* (2013.01); *G09G 2320/0295* (2013.01); *G09G 2320/043* (2013.01)

(56) References Cited

U.S. PATENT DOCUMENTS

| | | | |
|---|---|---|---|
| 8,289,261 | B2 | 10/2012 | Lee et al. |
| 2006/0038500 | A1 | 2/2006 | Lee et al. |
| 2006/0202977 | A1* | 9/2006 | Oh .................. G09G 3/325 345/204 |
| 2006/0291610 | A1 | 12/2006 | Lo et al. |
| 2007/0091029 | A1 | 4/2007 | Uchino et al. |
| 2007/0296662 | A1 | 12/2007 | Lee et al. |
| 2009/0135166 | A1 | 5/2009 | Uchino et al. |
| 2010/0134469 | A1 | 6/2010 | Ogura et al. |
| 2010/0182227 | A1 | 7/2010 | Tsou |
| 2010/0188385 | A1 | 7/2010 | Boiko |
| 2010/0201659 | A1 | 8/2010 | Miyake et al. |
| 2010/0207667 | A1 | 8/2010 | Kwon et al. |
| 2011/0157112 | A1 | 6/2011 | Shibata et al. |
| 2011/0164071 | A1 | 7/2011 | Chung et al. |
| 2011/0279429 | A1 | 11/2011 | Kim et al. |
| 2012/0287103 | A1 | 11/2012 | Wu et al. |
| 2013/0307840 | A1 | 11/2013 | Lee et al. |
| 2014/0085285 | A1 | 3/2014 | Kim |
| 2014/0169518 | A1 | 6/2014 | Kong et al. |
| 2014/0176410 | A1 | 6/2014 | Ma et al. |
| 2014/0240209 | A1 | 8/2014 | Zhang |
| 2015/0077319 | A1 | 3/2015 | Yao et al. |
| 2016/0064098 | A1 | 3/2016 | Han et al. |
| 2016/0111065 | A1 | 4/2016 | Wang et al. |

FOREIGN PATENT DOCUMENTS

| | | |
|---|---|---|
| CN | 101122720 A | 2/2008 |
| CN | 101183508 A | 5/2008 |
| CN | 101271667 A | 9/2008 |
| CN | 101276547 A | 10/2008 |
| CN | 101339737 A | 1/2009 |
| CN | 101364392 A | 2/2009 |
| CN | 101556762 A | 10/2009 |
| CN | 101556763 A | 10/2009 |
| CN | 101770745 A | 7/2010 |
| CN | 102298900 A | 12/2011 |
| CN | 102592561 A | 7/2012 |
| CN | 102654972 A | 9/2012 |
| CN | 102708824 A | 10/2012 |
| CN | 102930822 A | 2/2013 |
| CN | 102956269 A | 3/2013 |
| CN | 202917146 U | 5/2013 |
| CN | 103218970 A | 7/2013 |
| CN | 103236236 A | 8/2013 |
| CN | 203179475 U | 9/2013 |
| CN | 203179476 U | 9/2013 |
| CN | 103440840 A | 12/2013 |
| CN | 103714780 A | 4/2014 |
| CN | 103714781 A | 4/2014 |
| CN | 103730089 A | 4/2014 |
| EP | 2237253 A1 | 10/2010 |
| JP | 2007140318 A | 6/2007 |
| KR | 20060091465 A | 8/2006 |

OTHER PUBLICATIONS

International Search Report and Written Opinion dated Apr. 25, 2014 regarding PCT/CN2014/076261.

Chinese Office Action dated Feb. 13, 2015 regarding Chinese Application No. 201310722407.0. Translation provided by Dragon Intellectual Property Law Firm.

Chinese Office Action dated Sep. 11, 2014 regarding Application No. 201310722407.0, filed Dec. 24, 2013. Translation provided by Dragon Intellectual Property Law Firm.

=first Office Action regarding Chinese Application No. 201310738811.7 dated May 6, 2015. Translation provided by Dragon Intellectual Property Law Firm.

Written Opinion of the International Searching Authority regarding Inernational Application No. PCT/CN2014/078725. Translation provided by Dragon Intellectual Property Law Firm.

First Office Action regarding Chinese Application No. 201310745360.X dated Sep. 12, 2014. Translation Provided by Dragon Intellectual Property Law Firm.

Second Office Action regarding Chinese Application No. 201310745360.X dated Mar. 30, 2015. Translation provided by Dragon Intellectual Property Law Firm.

Third Office Action regarding Chinese Application No. 201310745360.X dated Jul. 30, 2015. Translation provided by Dragon Intellectual Property Law Firm.

Written Opinion of the International Searching Authority regarding International Application No. PCT/CN2014/076258. Translation provided by Dragon Intellectual Property Law Firm.

* cited by examiner

GATE DRIVER CIRCUIT, GATE DRIVING METHOD, GATE-ON-ARRAY CIRCUIT, DISPLAY DEVICE, AND ELECTRONIC PRODUCT

CROSS-REFERENCE TO RELATED APPLICATION

This application is the U.S. national phase of PCT Application No. PCT/CN2014/076261 filed on Apr. 25, 2014, which claims priority to Chinese patent application No. 201310722407.0 filed on Dec. 24, 2013. Each application is incorporated herein by reference in its entirety.

TECHNICAL FIELD

The present disclosure relates to the field of display technology, in particular to a gate driver circuit, a gate driving method, a gate-on-array circuit, a display device and an electronic product.

BACKGROUND

Currently, there is no GOA (gate-on-array, which means that a gate driver circuit is directly formed on an array substrate) circuit capable of providing Vth (threshold voltage) compensation for a pixel of an OLED (organic light-emitting diode) display panel in the prior art, and only a pixel design with a Vth compensation function or a single-pulse GOA circuit is applied.

Usually, an OLED pixel design of a current-controlled mode is adopted, so the display evenness of the OLED display panel will be reduced due to the uneven Vth of the entire OLED display panel and a Vth shift generated after the long-term operation. In order to improve an integration level of the OLED display panel and reduce the production cost, the use of an integrated gate driver technology is a trend of development in future. However, a peripheral driver circuit is desired for the OLED Vth compensation pixel design, and as a result, more requirements are put forward on the GOA circuit.

SUMMARY

A main object of the present disclosure is to provide a gate driver circuit, a gate driving method, a GOA circuit, a display device, and an electronic device, so as to compensate for a threshold voltage of a pixel and drive the pixel simultaneously, thereby to improve an integration level.

In one aspect, the present disclosure provides a gate driver circuit connected to a row of pixel units each includes a pixel driving module and a light-emitting device connected to each other, the pixel driving module including a driving transistor, a driving module and a compensating module, the compensating module being connected to a first row scanning signal, and the driving module being connected to a second row scanning signal and a driving voltage.

The gate driver circuit further includes a row pixel controlling unit configured to provide the first row scanning signal to the compensating module and provide the second row scanning signal and the driving voltage to the driving module, so as to control the compensating module to compensate for a threshold voltage of the driving transistor and control the driving module to drive the light-emitting device.

During the implementation, the row pixel controlling unit includes a start signal input end, a first control clock input end, a second control clock input end, a reset signal input end, a first input clock end, a second input clock end, a third input clock end, a carry signal output end, a cut-off control signal output end, an output level end, an output level pull-down control end, a first row scanning signal output end, a second row scanning signal output end, and a second row scanning signal pull-down control end.

The row pixel controlling unit further includes:

a pull-up node potential pull-up module configured to pull up a potential of a pull-up node to a high level when a first control clock signal and a start signal are at a high level;

a storage capacitor connected between the pull-up node and the carry signal output end;

a pull-up node potential pull-down module configured to pull down the potential of the pull-up mode to a first low level when a potential of a first pull-down node or a second pull-down node is a high level;

a first control clock switch configured to enable the first control clock input end to be electrically connected to the first pull-down node when the first control clock signal is at a high level;

a second control clock switch configured to enable the second control clock input end to be electrically connected to the second pull-down node when a second control clock signal is at a high level;

a first pull-down node potential pull-down module configured to pull down the potential of the first pull-down node to the first low level when the potential of the pull-up node or the second pull-down node is a high level;

a second pull-down node potential pull-down module connected to the reset signal input end and configured to pull down the potential of the second pull-down node to the first low level when the potential of the pull-up node or the first pull-down node is a high level;

a carry control module configured to enable the carry signal output end to be electrically connected to the second clock signal input end when the potential of the pull-up node is a high level;

a carry signal pull-down module configured to pull down a potential of a carry signal to the first low level when the potential of the first pull-down node or the second pull-down node is a high level;

a cut-off control module configured to enable the second clock signal input end to be electrically connected to the cut-off control signal output end when the potential of the pull-up node is a high level, and enable the cut-off control signal output end to be electrically connected to a second low level output end when the potential of the first pull-down node or the second pull-down node is a high level;

a feedback module configured to transmit a cut-off control signal to the pull-up node potential pull-up module and the pull-up node potential pull-down module when the carry signal is at a high level;

a first input clock switch configured to enable the first input clock end to be electrically connected to the first row scanning signal output end when the potential of the pull-up node is a high level;

a second input clock switch configured to enable the second input clock end to be electrically connected to the output level pull-down control end when the potential of the pull-up node is a high level;

a third input clock switch configured to enable the third input clock end to be electrically connected to the second row scanning signal pull-down control end when the potential of the pull-up node is a high level;

a first row scanning signal pull-down module configured to pull down a potential of the first row scanning signal to a second low level when the potential of the first pull-down node or the second pull-down node is a high level;

an output level pull-down control module configured to pull down a potential of the output level pull-down control end to the second low level when the potential of the first pull-down node or the second pull-down node is a high level;

an output level pull-up module configured to pull up an output level to a high level when the output level pull-down control end outputs the second low level;

an output level pull-down module configured to pull down the output level to the second low level when the output level pull-down control end outputs a high level;

a second row scanning signal pull-down control module configured to pull down a potential of the second row scanning signal pull-down control end to the second low level when the potential of the first pull-down node or the second pull-down node is a high level;

a second row scanning signal pull-up module configured to pull up a potential of the second scanning signal to a high level when the second row scanning signal pull-down control end outputs a high level; and a second row scanning signal pull-down module configured to pull down the potential of the second row scanning signal to the second low level when the second row scanning signal pull-down control end outputs a high level.

During the implementation, the pull-up node potential pull-up module includes:

a first pull-up node potential pull-up transistor, a gate electrode of which is connected to a first electrode and the start signal input end, and a second electrode of which is connected to the feedback module; and a second pull-up node potential pull-up transistor, a gate electrode of which is connected to the first control clock input end, a first electrode of which is connected to the second electrode of the first pull-up node potential pull-up transistor, and a second electrode of which is connected to the pull-up node.

The pull-up node potential pull-down module includes:

a first pull-up node potential pull-down transistor, a gate electrode of which is connected to the first pull-down node, a first electrode of which is connected to the pull-up node, and a second electrode of which is connected to the feedback module;

a second pull-up node potential pull-down transistor, a gate electrode of which is connected to the first pull-down node, a first electrode of which is connected to the second electrode of the first pull-up node potential pull-down transistor, and a second electrode of which is connected to the first low level;

a third pull-up node potential pull-down transistor, a gate electrode of which is connected to the second pull-down node, a first electrode of which is connected to the pull-up node, and a second electrode of which is connected to the feedback module; and a fourth pull-up node potential pull-down transistor, a gate electrode of which is connected to the second pull-down node, a first electrode of which is connected to the second electrode of the third pull-up node potential pull-down transistor, and a second electrode of which is connected to the first low level.

The first pull-down node potential pull-down module includes:

a first pull-down transistor, a gate electrode of which is connected to the pull-down node, a first electrode of which is connected to the first pull-down node, and a second electrode of which is connected to the reset signal input end;

a second pull-down transistor, a gate electrode of which is connected to the pull-up node, a first electrode of which is connected to the second electrode of the first pull-down transistor, and a second electrode of which is connected to the first low level; and a third pull-down transistor, a gate electrode of which is connected to the second pull-down node, a first electrode of which is connected to the first pull-down node, and a second electrode of which is connected to the first low level.

The second pull-down node potential pull-down module includes:

a fourth pull-down transistor, a gate electrode of which is connected to the pull-up node, a first electrode of which is connected to the second pull-down node, and a second electrode of which is connected to the reset signal input end;

a fifth pull-down transistor, a gate electrode of which is connected to the pull-up node, a first electrode of which is connected to the second electrode of the fourth pull-down transistor, and a second electrode of which is connected to the first low level; and a sixth pull-down transistor, a gate electrode of which is connected to the first pull-down node, a first electrode of which is connected to the second pull-down node, and a second electrode of which is connected to the first low level.

During the implementation, the carry control module includes:

a carry control transistor, a gate electrode of which is connected to the pull-up node, a first electrode of which is connected to the second control clock input end, and a second electrode of which is connected to the carry signal output end.

The carry signal pull-down module includes:

a first carry signal pull-down transistor, a gate electrode of which is connected to the first pull-down node, a first electrode of which is connected to the carry signal output end, and a second electrode of which is connected to the first low level; and a second carry signal pull-down transistor, a gate electrode of which is connected to the second pull-down node, a first electrode of which is connected to the carry signal output end, and a second electrode of which is connected to the first low level.

The cut-off control module includes:

a first cut-off control transistor, a gate electrode of which is connected to the pull-up node, a first electrode of which is connected to the second control clock input end, and a second electrode of which is connected to the cut-off control signal output end;

a second cut-off control transistor, a gate electrode of which is connected to the first pull-down node, a first electrode of which is connected to the cut-off control signal output end, and a second electrode of which is connected to the first low level; and a third cut-off control transistor, a gate electrode of which is connected to the second pull-down node, a first electrode of which is connected to the cut-off control signal output end, and a second electrode of which is connected to the first low level.

The feedback module includes:

a feedback transistor, a gate electrode of which is connected to the carry signal output end, a first electrode of which is connected to the second electrode of the first pull-up node potential pull-up transistor, and a second electrode of which is connected to the cut-off control signal output end.

During the implementation, the first row scanning signal pull-down module includes:

a first output pull-down transistor, a gate electrode of which is connected to the first pull-down node, a first electrode of which is connected to the first row scanning signal output end, and a second electrode of which is connected to the second low level; and a second output pull-down transistor, a gate electrode of which is connected to the second pull-down node, a first electrode of which is connected to the first row scanning signal output end, and a second electrode of which is connected to the second low level.

The output level pull-up module includes:

an output level pull-up transistor, a gate electrode and a first electrode of which are connected to a high level, and a second electrode of which is connected to the output level end.

The output level pull-down control module includes:

a first pull-down control transistor, a gate electrode of which is connected to the first pull-down node, a first electrode of which is connected to the output level pull-down control end, and a second electrode of which is connected to the second low level; and a second pull-down control transistor, a gate electrode of which is connected to the second pull-down node, a first electrode of which is connected to the output level pull-down control end, and a second electrode of which is connected to the second low level.

The output level pull-down module includes:

an output level pull-down transistor, a gate electrode of which is connected to the output level pull-down control end, a first electrode of which is connected to the output level end, and a second electrode of which is connected to the second low level.

The second row scanning signal pull-up module includes:

a row scanning pull-up transistor, a gate electrode and a first electrode of which is connected to a high level, and a second electrode of which is connected to the second row scanning signal output end.

The second row scanning signal pull-down control module includes:

a third pull-down control transistor, a gate electrode of which is connected to the first pull-down node, a first electrode of which is connected to the second row scanning signal pull-down control end, and a second electrode of which is connected to the second low level; and a fourth pull-down control transistor, a gate electrode of which is connected to the second pull-down node, a first electrode of which is connected to the second row scanning signal pull-down control end, and a second electrode of which is connected to the second low level.

The second row scanning signal pull-down module includes:

a third output pull-down transistor, a gate electrode of which is connected to the row scanning signal pull-down control end, a first electrode of which is connected to the second row scanning signal output end, and a second electrode of which is connected to the second low level.

During the implementation, the first control clock signal is complementary to the second control clock signal.

In another aspect, the present disclosure provides a gate driving method for use in the above-mentioned gate driver circuit, including:

at a first stage, setting a start signal to be at a low level, setting a first control clock signal to be at a low level, setting a second control clock signal to be at a high level, pulling up, by a second control clock switch, a potential of a second pull-down node to a high level, pulling down, by a pull-up node potential pull-down module, a potential of a pull-up node to a first low level, pulling down, by the first pull-down node potential pull-down module, the potential of the first pull-down node to the first low level, controlling, by an output level pull-up module, an output level end to output a high level, controlling, by a first row scanning signal pull-down module, a first row scanning signal output end to output a second low level, and controlling, by a second row scanning signal pull-up module, a second row scanning signal output end to output a high level;

at a second stage, setting the start signal to be at a high level, setting the first control clock signal to be at a high level, setting the second control clock signal to be at a low level, pulling up, by the pull-up node potential pull-up module, the potential of the pull-up node to a high level, pulling down, by the first pull-down node potential pull-down module, the potential of the first pull-down node to the first low level, pulling down, by a second pull-down node potential pull-down module, a potential of a second pull-down node to the first low level, turning on a first input clock switch, a second input clock signal and a third input clock switch, setting a first input clock signal, a second input clock signal and a third input clock signal to be at a low level, and maintaining signals from an output level end, a first row scanning signal output end and a second row scanning signal output end to be unchanged;

at a third stage, setting the start signal to be at a low level, setting the first control clock signal to be at a low level, setting the second control clock signal to be at a high level, maintaining the potential of the pull-up node to be at a high level, pulling down, by the first pull-down node potential pull-down module, the potential of the first pull-down node to the first low level, pulling down, by the second pull-down node potential pull-down module, the potential of the second pull-down node to the first low level, turning on the first input clock switch, the second input clock switch and the third input clock switch, setting the first input clock signal, the second input clock signal and the third input clock signal to be at a high level, outputting a high level by the first row scanning signal output end, outputting a high level by an output level pull-down control end, controlling, by an output level pull-down module, the output level end to output the second low level, outputting a high level by the second row scanning signal pull-down control end, and controlling, by the second row scanning signal pull-down module, the second row scanning signal output end to output the second low level; and at a fourth stage, setting the start signal to be at a low level, setting the first control clock signal to be at a high level, setting the second control clock signal to be at a low level, pulling down, by the pull-up node potential pull-down module, the potential of the pull-up node to the first low level, turning on the second control clock switch so as to pull up the potential of the second pull-down node to a high level, pulling down, by the first pull-down node potential pull-down module, the potential of the first pull-down node to the first low level, turning off the first input clock switch, the second input clock switch and the third input clock switch, pulling down, by the first row scanning signal pull-down module, the potential of the first row scanning signal to the second low level, controlling, by the output level pull-down control module, the output level pull-down control end to output the second low level, controlling, by the output level pull-up module, the output level end to output a high level, controlling, by the second row scanning signal pull-down control module, the second row scanning signal pull-down control end to output the second low level, and pulling up, by the second row scanning signal pull-up module, the potential of the second row scanning signal to a high level.

In yet another aspect, the present disclosure provides a GOA circuit including multiple levels of the above-mentioned gate driver circuits. Apart from a first-level gate driver circuit, a cut-off control signal output end of each level of gate driver circuit is connected to a reset signal input end of a previous level of the gate driver circuit, and apart from a last-level gate driver circuit, a carry signal output end of each level of gate driver circuit is connected to a start signal input end of a next level of gate driver circuit.

During the implementation, a first input clock signal, a second input clock signal and a third input clock signal inputted to an $(n+1)^{th}$-level gate driver circuit are complementary to a first input clock signal, a second input clock signal and a third input clock signal inputted to an $n^{th}$-level gate driver circuit, wherein n is an integer greater than or equal to 1, and n+1 is less than or equal to the number of levels of the gate driver circuits included in the GOA circuit.

In still yet another aspect, the present disclosure provides a display device including the above-mentioned gate driver circuit. During the implementation, the display device is an OLED display device or a low temperature poly-silicon (LTPS) display device.

In still yet another aspect, the present disclosure provides an electronic product including the above-mentioned display device.

As compared with the prior art, the gate driver circuit, the gate driving method, the GOA circuit, the display device and the electronic device of the present disclosure, the row pixel controlling unit is set to control the compensating module to compensate for the threshold voltage of the driving transistor, and control the driving module to drive the light-emitting device, so as to compensate for the pixel threshold voltage and drive the pixel simultaneously. In addition, by applying the gate driver circuit and the GOA circuit of the present disclosure to an OLED display panel, it is able to improve the integration level of the OLED display panel, thereby to reduce the protection cost.

DETAILED DESCRIPTION

A gate driver circuit of the present disclosure is connected to a row of pixel units, each of them includes a pixel driving module and a light-emitting device connected to each other. The pixel driving module includes a driving transistor, a driving module and a compensating module, the compensating module is connected to a first row scanning signal, and the driving module is connected to a second row scanning signal and a driving voltage.

The gate driver circuit further includes a row pixel controlling unit configured to provide the first row scanning signal to the compensating module and provide the second row scanning signal and the driving voltage to the driving module, so as to control the compensating module to compensate for a threshold voltage of the driving transistor and control the driving module to drive the light-emitting device.

According to the gate driver circuit of the present disclosure, a row pixel controlling unit is provided to control the compensating module to compensate for the threshold voltage of the driving transistor and control the driving module to drive the row pixel controlling unit of the light-emitting devices. As a result, the gate driver circuit capable of compensating for the pixel threshold voltage is provided.

The gate driver circuit of the present disclosure may be applied to an OLED display panel, so as to improve an integration level of the OLED display panel, thereby to reduce the production cost.

Figure 1A:
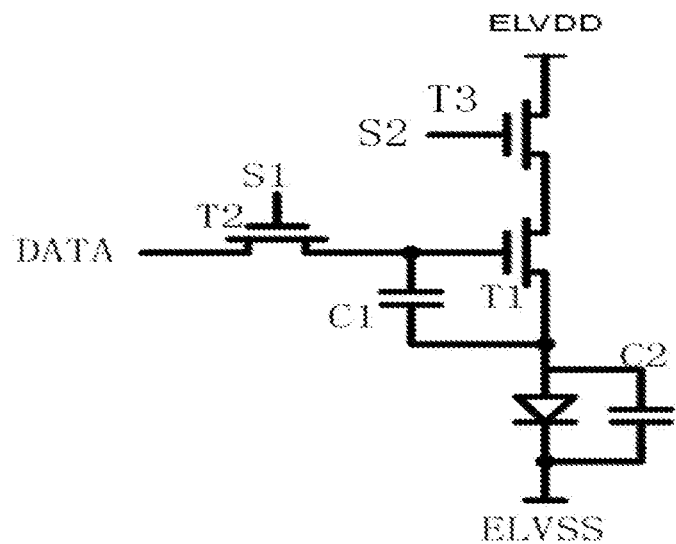
FIG. 1A is a circuit diagram showing a pixel driving module included in a gate driver circuit according to one embodiment of the present disclosure.

As shown in FIG. 1A, the pixel driving module according to one embodiment includes a driving transistor T1, a compensating transistor T2, a driving control transistor T3, a first capacitor C1 and a second capacitor C2. T2 is included in the compensating module, and T3 is included in a driving control module. A gate electrode of T2 is connected to a first row scanning signal S1, a second electrode of T2 is connected to a data signal DATA, a gate electrode of T3 is connected to a second row scanning signal S2, and a first electrode of T3 is connected to an output level ELVDD. A cathode of the OLED is connected to a level ELVSS.

Figure 1B:
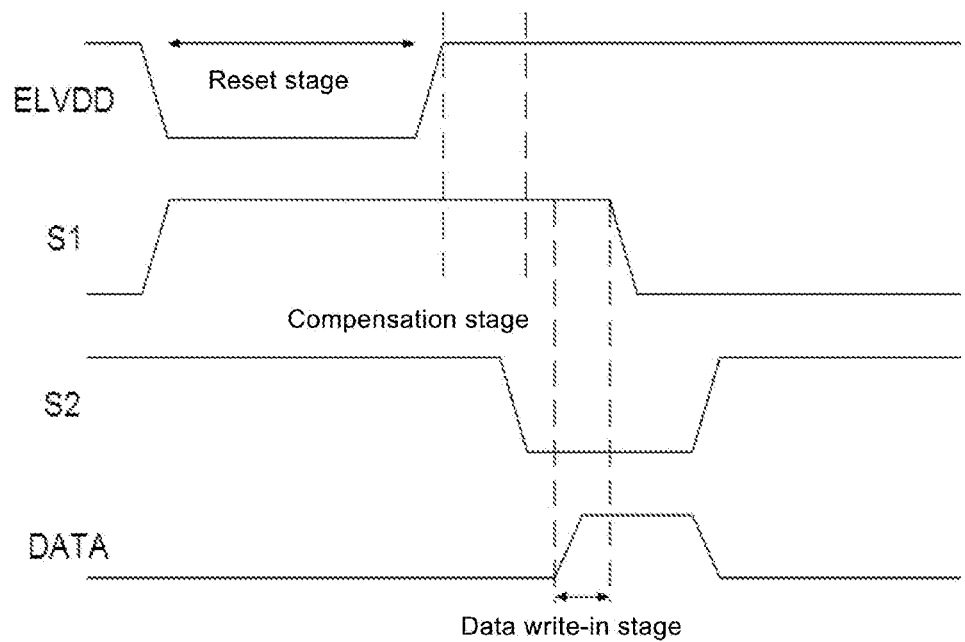
FIG. 1B is an operation sequence diagram of the pixel driving module in FIG. 1A.

FIG. 1B is an operation sequence diagram of the pixel driving module in FIG. 1A.

Figure 2:
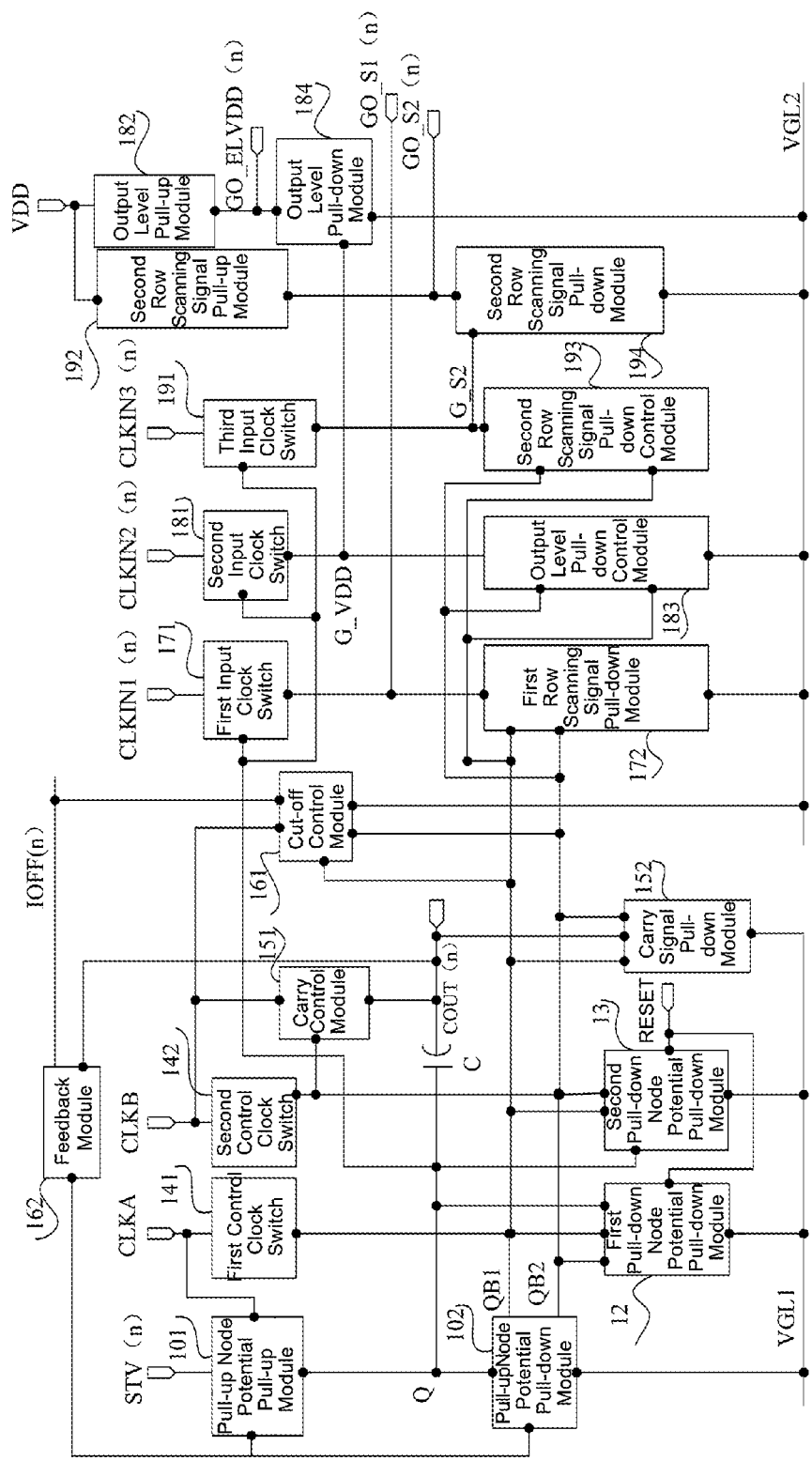
FIG. 2 is a block diagram showing the gate driver circuit according to one embodiment of the present disclosure.

As shown in FIG. 2, in the gate driver circuit of the present disclosure, the row pixel controlling unit includes a start signal input end STV, a first control clock input end CLKA, a second control clock input end CLKB, a reset signal input end RESET, a first input clock end CLKIN1 (n), a second input clock end CLKIN2 (n), a third input clock end CLKIN3 (n), a carry signal output end COUT (n), a cut-off control signal output end IOFF (n), an output level end GO_ELVDD (n), an output level pull-down control end G_VDD, a first row scanning signal output end GO_S1 (n), a second row scanning signal output end GO_S2 (n), and a second row scanning signal pull-down control end G_S2.

The row pixel controlling unit further includes:

a pull-up node potential pull-up module 101 configured to pull up a potential of a pull-up node Q to a high level when a first control clock signal and a start signal are at a high level;

a storage capacitor C connected between the pull-up node Q and the carry signal output end COUT (n);

a pull-up node potential pull-down module 102 configured to pull down the potential of the pull-up mode Q to a first low level VGL1 when a potential of a first pull-down node QB1 or a second pull-down node QB2 is a high level;

a first control clock switch 141 configured to enable the first control clock input end CLKA to be electrically connected to the first pull-down node QB1 when the first control clock signal is at a high level;

a second control clock switch 142 configured to enable the second control clock input end CLKB to be electrically connected to the second pull-down node QB2 when a second control clock signal is at a high level;

a first pull-down node potential pull-down module 12 configured to pull down the potential of the first pull-down node QB1 to the first low level VGL1 when the potential of the pull-up node Q or the second pull-down node QB2 is a high level;

a second pull-down node potential pull-down module 13 connected to the reset signal input end RESET and configured to pull down the potential of the second pull-down node QB2 to the first low level VGL1 when the potential of the pull-up node Q or the first pull-down node QB1 is a high level;

a carry control module 151 configured to enable the carry signal output end COUT (n) to be electrically connected to the second clock signal input end CLKB when the potential of the pull-up node Q is a high level;

a carry signal pull-down module 152 configured to pull down a potential of a carry signal to the first low level VGL1 when the potential of the first pull-down node QB1 or the second pull-down node QB2 is a high level;

a cut-off control module 161 configured to enable the second clock signal input end CLKB to be electrically connected to the cut-off control signal output end IOFF (n) when the potential of the pull-up node Q is a high level, and enable the cut-off control signal output end IOFF (n) to be electrically connected to a second low level output end when the potential of the first pull-down node QB1 or the second pull-down node QB2 is a high level, the second low level output end outputting a second low level VGL2;

a feedback module 162 configured to transmit a cut-off control signal to the pull-up node potential pull-up module 101 and the pull-up node potential pull-down module 102 when the carry signal is at a high level;

a first input clock switch 171 configured to enable the first input clock end CLKIN1 (n) to be electrically connected to the first row scanning signal output end GO_S1 (n) when the potential of the pull-up node Q is a high level;

a second input clock switch 181 configured to enable the second input clock end CLKIN2 (n) to be electrically connected to the output level pull-down control end GO_ELVDD (n) when the potential of the pull-up node Q is a high level;

a third input clock switch 191 configured to enable the third input clock end CLKIN3 (n) to be electrically connected to the second row scanning signal pull-down control end GO_S2 (n) when the potential of the pull-up node Q is a high level;

a first row scanning signal pull-down module 172 configured to pull down a potential of the first row scanning signal to the second low level VGL2 when the potential of the first pull-down node QB1 or the second pull-down node QB2 is a high level;

an output level pull-up module 182 configured to pull up an output level to a high level VDD when the output level pull-down control end GO_ELVDD (n) outputs the second low level VGL2;

an output level pull-down control module 183 configured to pull down a potential of the output level pull-down control end GO_ELVDD (n) to the second low level VGL2 when the potential of the first pull-down node QB1 or the second pull-down node QB2 is a high level;

an output level pull-down module 184 configured to pull down the output level to the second low level VGL2 when the output level pull-down control end GO_ELVDD (n) outputs a high level;

a second row scanning signal pull-up module 192 configured to pull up a potential of the second row scanning signal to the high level VDD when the second row scanning signal pull-down control end G_S2 outputs a high level;

a second row scanning signal pull-down control module 193 configured to pull down a potential of the second row scanning signal pull-down control end G_S2 to the second low level VGL2 when the potential of the first pull-down node QB1 or the second pull-down node QB2 is a high level; and a second row scanning signal pull-down module 194 configured to pull down the potential of the second scanning signal to the second low level VGL2 when the second row scanning signal pull-down control end G_S2 outputs a high level.

The gate driver circuit of this embodiment includes two pull-down nodes, i.e., the first pull-down node QB1 and the second pull-down node QB2, so as to pull down the output. During a non-output period, the first pull-down node QB1 and the second pull-down node QB2 are alternating and complementary to each other. As a result, it is able to reduce a threshold voltage shift and prevent the occurrence of a time interval when pulling down the output, thereby to improve the stability and reliability.

During the operation of the gate driver circuit of this embodiment, it is able to compensate for the pixel threshold voltage and drive the pixel by adjusting the start signal, the first control clock signal, the second control clock signal, the first input clock signal, the second input clock signal and the third input clock signal.

Here, the types of the transistors used in all the embodiments of the present disclosure are not particularly defined. In other words, the transistor may be a TFT or FET, or any other device having the same characteristics. In the embodiments of the present disclosure, in order to differentiate two electrodes of the transistor except a gate electrode, one of the electrodes is called as a source electrode, and the other is called as a drain electrode. In addition, the transistor may be an N-type or P-type transistor on the basis of its characteristics. It is readily conceivable for a person skilled in the art, without any creative effort, to implement the driver circuit of the present disclosure with the N-type or P-type transistors, and it also falls within the scope of the present disclosure.

In the driver circuit of the present disclosure, a first electrode of the N-type transistor may be a source electrode, and a second electrode thereof may be a drain electrode. A first electrode of the P-type transistor may be a drain electrode, and a second electrode thereof may be a source electrode.

Figure 3:
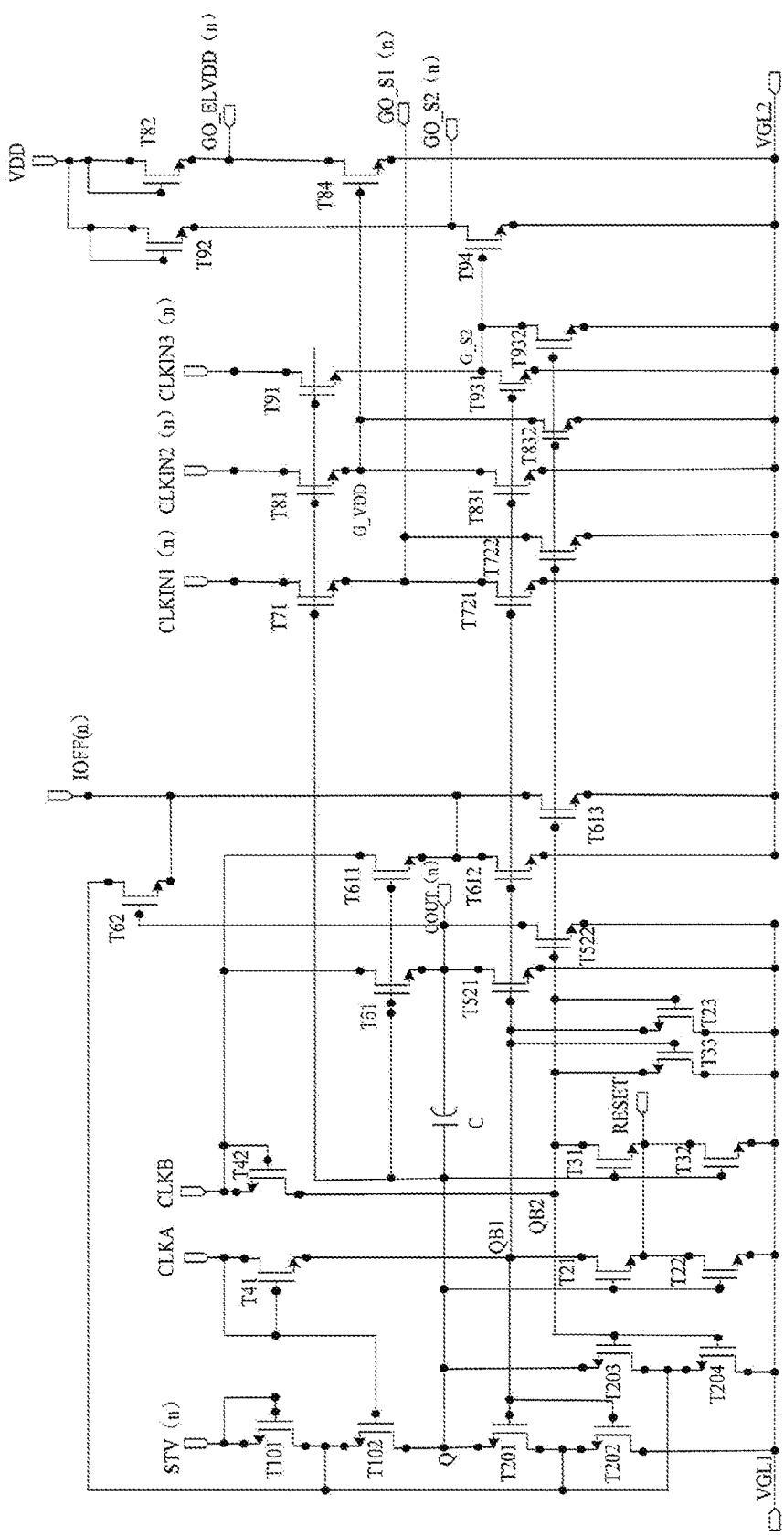
FIG. 3 is a circuit diagram showing the gate driver circuit according to one embodiment of the present disclosure.

To be specific, as shown in FIG. 3, the pull-up node potential pull-up module 101 of the gate driver circuit includes:

a first pull-up node potential pull-up transistor T101, a gate electrode of which is connected to a first electrode and the start signal input end STV, and a second electrode of which is connected to the feedback module 162; and a second pull-up node potential pull-up transistor T102, a gate electrode of which is connected to the first control clock input end CLKA, a first electrode of which is connected to the second electrode of the first pull-up node potential pull-up transistor T101, and a second electrode of which is connected to the pull-up node Q.

The pull-up node potential pull-down module 102 includes:

a first pull-up node potential pull-down transistor T201, a gate electrode of which is connected to the first pull-down node QB1, a first electrode of which is connected to the pull-up node Q, and a second electrode of which is connected to the feedback module 162;

a second pull-up node potential pull-down transistor T202, a gate electrode of which is connected to the first pull-down node QB1, a first electrode of which is connected to the second electrode of the first pull-up node potential pull-down transistor T201, and a second electrode of which is connected to the first low level VGL1;

a third pull-up node potential pull-down transistor T203, a gate electrode of which is connected to the second pull-down node QB2, a first electrode of which is connected to the pull-up node Q, and a second electrode of which is connected to the feedback module 162; and a fourth pull-node potential pull-down transistor T204, a gate electrode of which is connected to the second pull-down node QB2, a first electrode of which is connected to the second electrode of the third pull-up node potential pull-down transistor T203, and a second electrode of which is connected to the first low level VGL1.

The first pull-down node potential pull-down module 12 includes:

a first pull-down transistor T21, a gate electrode of which is connected to the pull-up node Q, a first electrode of which is connected to the first pull-down node QB1, and a second electrode of which is connected to the reset signal input end RESET;

a second pull-down transistor T22, a gate electrode of which is connected to the pull-up node Q, a first electrode of which is connected to the second electrode of the first pull-down transistor T21, and a second electrode of which is connected to the first low level VGL1; and a third pull-down transistor T23, a gate electrode of which is connected to the second pull-down node QB2, a first electrode of which is connected to the first pull-down node QB1, and a second electrode of which is connected to the first low level VGL1.

The second pull-down node potential pull-down module 13 includes:

a fourth pull-down transistor T31, a gate electrode of which is connected to the pull-up node Q, a first electrode of which is connected to the second pull-down node QB2, and a second electrode of which is connected to the reset signal input end RESET;

a fifth pull-down transistor T32, a gate electrode of which is connected to the pull-up node Q, a first electrode of which is connected to the second electrode of the fourth pull-down transistor T31, and a second electrode of which is connected to the first low level VGL1; and a sixth pull-down transistor T33, a gate electrode of which is connected to the first pull-down node QB1, a first electrode of which is connected to the second pull-down node QB2, and a second electrode of which is connected to the first low level VGL1.

Referring to FIGS. 2 and 3, the carry control module 151 includes:

a carry control transistor T51, a gate electrode of which is connected to the pull-up node Q, a first electrode of which is connected to the second control clock input end CLKB, and a second electrode of which is connected to the carry signal output end COUT (n).

The carry signal pull-down module 152 includes:

a first carry signal pull-down transistor T521, a gate electrode of which is connected to the first pull-down node QB1, a first electrode of which is connected to the carry signal output end COUT (n), and a second electrode of which is connected to the first low level VGL1; and a second carry signal pull-down transistor T522, a gate electrode of which is connected to the second pull-down node QB2, a first electrode of which is connected to the carry signal output end COUT (n), and a second electrode of which is connected to the first low level VGL1.

The cut-off control module 161 includes:

a first cut-off control transistor T611, a gate electrode of which is connected to the pull-up node Q, a first electrode of which is connected to the second control clock input end CLKB, and a second electrode of which is connected to the cut-off control signal output end IOFF (n);

a second cut-off control transistor T612, a gate electrode of which is connected to the first pull-down node QB1, a first electrode of which is connected to the cut-off control signal output end IOFF (n), and a second electrode of which is connected to the first low level VGL1; and a third cut-off control transistor T613, a gate electrode of which is connected to the second pull-down node QB2, a first electrode of which is connected to the cut-off control signal output end IOFF (n), and a second electrode of which is connected to the first low level VGL1.

The feedback module 162 includes:

a feedback transistor T62, a gate electrode of which is connected to the carry signal output end COUT (n), a first electrode of which is connected to the second electrode of the first pull-up node potential pull-up transistor T101, and a second electrode of which is connected to the cut-off control signal output end IOFF (n).

As shown in FIG. 3, the first input clock switch 171 includes a first input transistor T71, a gate electrode of which is connected to the pull-up node Q, a first electrode of which is connected to CLKIN1 (n), and a second electrode of which is connected to GO_S1 (n).

The first row scanning signal pull-down module 172 includes:

a first output pull-down transistor T721, a gate electrode of which is connected to the first pull-down node QB1, a first electrode of which is connected to the first row scanning signal output end GO_S1 (n), and a second electrode of which is connected to the second low level VGL2; and a second output pull-down transistor T722, a gate electrode of which is connected to the second pull-down node QB2, a first electrode of which is connected to the first row scanning signal output end GO_S1 (n), and a second electrode of which is connected to the second low level VGL2.

The second input clock switch 181 includes a second input transistor T81, a gate electrode of which is connected to the pull-up node Q, a first electrode of which is connected to CLKIN2 (n), and a second electrode of which is connected to G_VDD.

The output level pull-up module 182 includes:

an output level pull-up transistor T82, a gate electrode and a first electrode of which are connected to the high level VDD, and a second electrode of which is connected to the output level end GO_ELVDD (n).

The output level pull-down control module 183 includes:

a first pull-down control transistor T831, a gate electrode of which is connected to the first pull-down node QB1, a first electrode of which is connected to the output level pull-down control end G_VDD, and a second electrode of which is connected to the second low level VGL2; and a second pull-down control transistor T832, a gate electrode of which is connected to the second pull-down node QB2, a first electrode of which is connected to the output level pull-down control end G_VDD, and a second electrode of which is connected to the second low level VGL2.

The output level pull-down module 184 includes:

an output level pull-down transistor T84, a gate electrode of which is connected to the output level pull-down control end G_VDD, a first electrode of which is connected to the output level end GO_ELVDD (n), and a second electrode of which is connected to the second low level VGL2.

The third input clock switch 191 includes a third input transistor T91, a gate electrode of which is connected to the pull-up node Q, a first electrode of which is connected to CLKIN3 (n), and a second electrode of which is connected to G_S2.

The second row scanning signal pull-up module 192 includes:

a row scanning pull-up transistor T92, a gate electrode and a first electrode of which are connected to the high level VDD, and a second electrode of which is connected to the second row scanning signal output end GO_S2 (n).

The second row scanning signal pull-down control module 193 includes:

a third pull-down control transistor T931, a gate electrode of which is connected to the first pull-down node QB1, a first electrode of which is connected to the second row scanning signal pull-down control end G_S2, and a second electrode of which is connected to the second low level VGL2; and a fourth pull-down control transistor T932, a gate electrode of which is connected to the second pull-down node QB2, a first electrode of which is connected to the second row scanning signal pull-down control end G_S2, and a second electrode of which is connected to the second low level VGL2.

The second row scanning signal pull-down module 194 includes:

a third output pull-down transistor T94, a gate electrode of which is connected to the row scanning signal pull-down control end G_S2, a first electrode of which is connected to the second row scanning signal output end GO_S1 (n), and a second electrode of which is connected to the second low level VGL2.

During the implementation, the first control clock signal is complementary to the second control clock signal.

As shown in FIG. 3, the first control clock switch 141 includes a first control transistor T41, a gate electrode and a first electrode of which are connected to CLKA, and a second electrode of which is connected to QB1. The second control clock switch 142 includes a second control transistor T42, a gate electrode and a first electrode of which are connected to CLKB, and a second electrode of which is connected to QB2. The storage capacitor C is connected between Q and COUT (n).

In the embodiment as shown in FIG. 3, T101, T102, T42, T201, T202, T203, T204, T33 and T23 are P-type transistors, while T21, T22, T31, T32, T41, T51, T521, T522, T611, T612, T613, T62, T71, T721, T722, T81, T82, T831, T832, T84, T91, T92, T931, T932 and T94 are N-type transistors. In the other embodiments, various transistors may be adopted, as long as they can achieve the same control effects of turning on and turning off.

Figure 4:
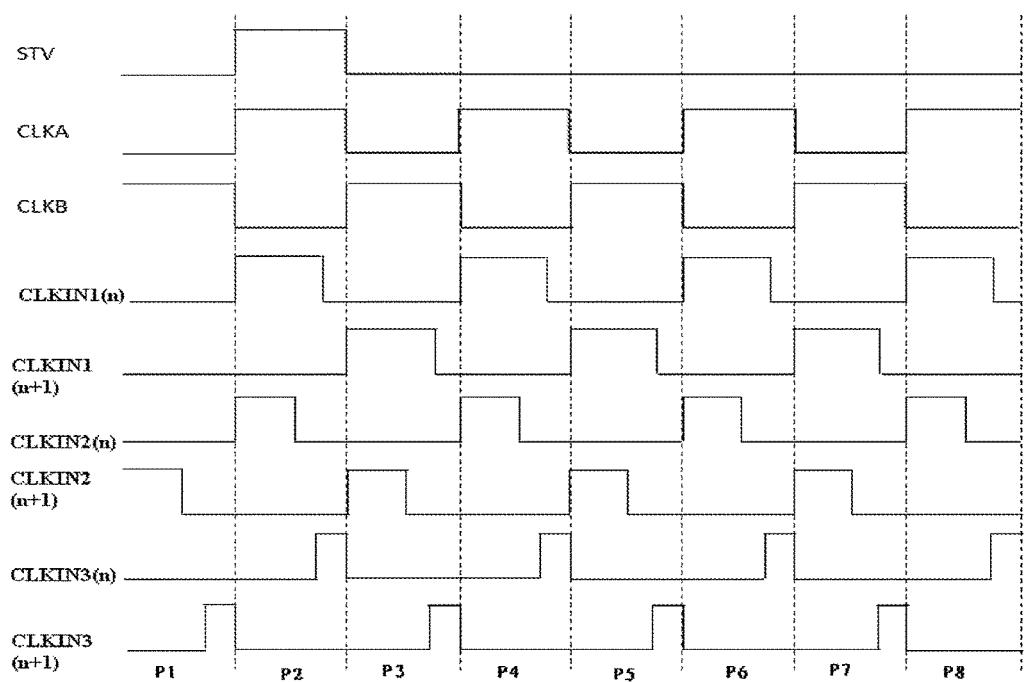
FIG. 4 is a waveform diagram showing a start signal, a first control clock signal, a second control clock signal, a first input clock signal inputted to an $n^{th}$-level gate driver circuit, a second input clock signal inputted to the $n^{th}$ gate driver circuit, a third input clock signal inputted to the $n^{th}$ gate driver circuit, a first input clock signal inputted to an $(n+1)^{th}$-level gate driver circuit, a second input clock signal inputted to the $(n+1)^{th}$-level gate driver circuit and a third input clock signal inputted to the $(n+1)^{th}$-level gate driver circuit during the operation of a GOA circuit according to one embodiment of the present disclosure.

During the implementation, as shown in FIG. 4, the first control clock signal is complementary to the second control clock signal.

The present disclosure further provides a gate driving method for use in the above-mentioned gate driver circuit, including the steps of:

at a first stage, setting the start signal to be at a low level, setting the first control clock signal to be at a low level, setting the second control clock signal to be at a high level, pulling up, by the second control clock switch, a potential of the second pull-down node to a high level, pulling down, by the pull-up node potential pull-down module, a potential of the pull-up node to the first low level, pulling down, by the first pull-down node potential pull-down module, the potential of the first pull-down node to the first low level, controlling, by the output level pull-up module, the output level end to output a high level, controlling, by the first row scanning signal pull-down module, the first row scanning signal output end to output a second low level, and controlling, by the second row scanning signal pull-up module, the second row scanning signal output end to output a high level;

at a second stage, setting the start signal to be at a high level, setting the first control clock signal to be at a high level, setting the second control clock signal to be at a low level, pulling up, by the pull-up node potential pull-up module, the potential of the pull-up node to a high level, pulling down, by the first pull-down node potential pull-down module, the potential of the first pull-down node to the first low level, pulling down, by the second pull-down node potential pull-down module, a potential of the second pull-down node to the first low level, turning on the first input clock switch, the second input clock signal and the third input clock switch, setting the first input clock signal, the second input clock signal and the third input clock signal to be at a low level, and maintaining signals from the output level end, the first row scanning signal output end and the second row scanning signal output end to be unchanged;

at a third stage, setting the start signal to be at a low level, setting the first control clock signal to be at a low level, setting the second control clock signal to be at a high level, maintaining the potential of the pull-up node to be at a high level, pulling down, by the first pull-down node potential pull-down module, the potential of the first pull-down node to the first low level, pulling down, by the second pull-down node potential pull-down module, the potential of the second pull-down node to the first low level, turning on the first input clock switch, the second input clock switch and the third input clock switch, setting the first input clock signal, the second input clock signal and the third input clock signal to be at a high level, outputting a high level by the first row scanning signal output end, outputting a high level by the output level pull-down control end, controlling, by the output level pull-down module, the output level end to output the second low level, outputting a high level by the second row scanning signal pull-down control end, and controlling, by the second row scanning signal pull-down module, the second row scanning signal output end to output the second low level; and at a fourth stage, setting the start signal to be at a low level, setting the first control clock signal to be at a high level, setting the second control clock signal to be at a low level, pulling down, by the pull-up node potential pull-down module, the potential of the pull-up node to the first low level, turning on the second control clock switch so as to pull up the potential of the second pull-down node to a high level, pulling down, by the first pull-down node potential pull-down module, the potential of the first pull-down node to the first low level, turning off the first input clock switch, the second input clock switch and the third input clock switch, pulling down, by the first row scanning signal pull-down module, the potential of the first row scanning signal to the second low level, controlling, by the output level pull-down control module, the output level pull-down control end to output the second low level, controlling, by the output level pull-up module, the output level end to output a high level, controlling, by the second row scanning signal pull-down control module, the second row scanning signal pull-down control end to output the second low level, and pulling up, by the second row scanning signal pull-up module, the potential of the second row scanning signal to a high level.

The present disclosure further provides a GOA circuit including multiple levels of the above-mentioned gate driver circuits. Apart from a first-level gate driver circuit, a cut-off control signal output end of each level of gate driver circuit is connected to a reset signal input end of a previous level of the gate driver circuit, and apart from a last-level gate driver circuit, a carry signal output end of each level of gate driver circuit is connected to a start signal input end of a next-level gate driver circuit.

During the implementation, a first input clock signal, a second input clock signal and a third input clock signal inputted to an $(n+1)^{th}$-level gate driver circuit are complementary to a first input clock signal, a second input clock signal and a third input clock signal inputted to an $n^{th}$-level gate driver circuit.

As shown in FIG. 4, a signal outputted from CLKIN1 (n) is complementary to a signal outputted from CLKIN1 (n+1), a signal outputted from CLKIN2 (n) is complementary to a signal outputted from CLKIN2 (n+1), and a signal outputted from CLKIN3 (n) is complementary to a signal outputted from CLKIN3 (n+1). n is an integer greater than or equal to 1, and (n+1) is less than or equal to the number of levels of the gate driver circuits included in the GOA circuit.

Figure 5:
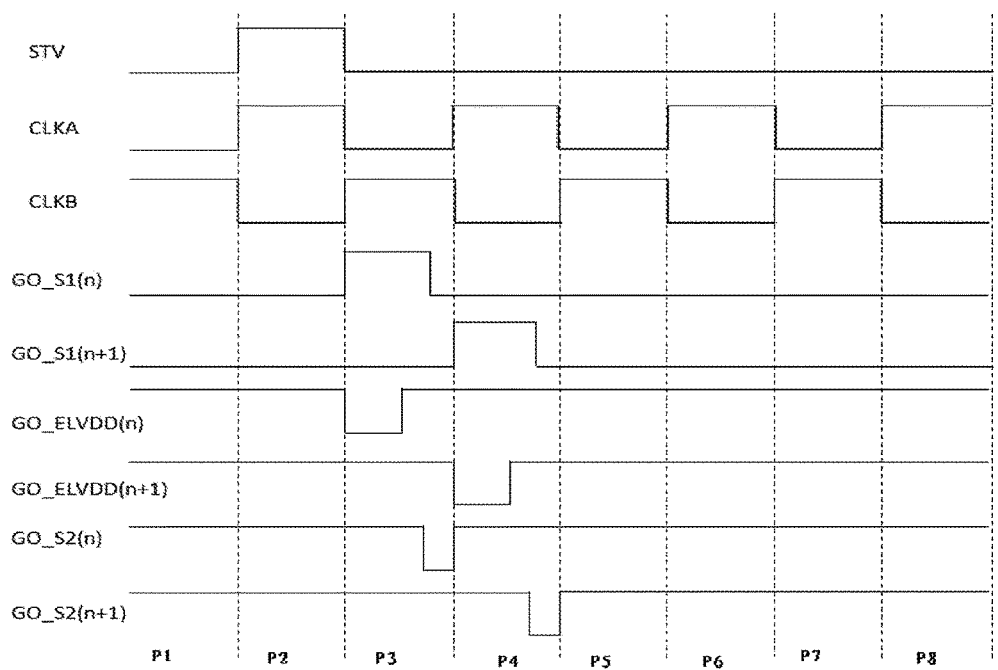
FIG. 5 is an operation sequence diagram of the GOA circuit according to one embodiment of the present disclosure.

As shown in FIG. 5, during the operation of the gate driver circuit in FIG. 3, at the first stage P1, the start signal is at a low level, the first control clock signal is at a low level, the second control clock signal is at a high level, the second control clock switch 142 pulls up the potential of the second pull-down node QB2 to a high level, the pull-up node potential pull-down module 102 pulls down the potential of the pull-up node Q to the first low level, the first pull-down node potential pull-down module 12 pulls down the potential of the first pull-down node QB1 to the first low level VGL1, the output level pull-up module 182 controls the output level end GO_ELVDD (n) to output a high level, the first row scanning signal pull-down module 172 controls the first row scanning signal output end GO_S1 (n) to output the second low level VGL2, and the second row scanning signal pull-up module 192 controls the second row scanning signal output end GO_S2 (n) to output the high level VDD.

At the second stage P2, the start signal is at a high level, the first control clock signal is at a high level, the second control clock signal is at a low level, the pull-up node potential pull-up module 101 pulls up the potential of the pull-up node Q to a high level, the first pull-down node potential pull-down module 12 pulls down the potential of the first pull-down node QB1 to the first low level VGL1, the second pull-down node potential pull-down module 13 pulls down the potential of the second pull-down node QB2 to the first low level VGL1, the first input clock switch CLKIN1 (n), the second input clock switch CLKIN2 (n) and the third input clock switch CLKIN3 (n) are turned on, the first input clock signal, the second input clock signal and the third input clock signal are at a low level, and the signals from the output level end GO_ELVDD (n), the first row scanning signal output end GO_S1 (n) and the second row scanning signal output end GO_S2 (n) are maintained to be unchanged.

At the third stage P3, the start signal is at a low level, the first control clock signal is at a low level, the second control clock signal is at a high level, the potential of the pull-up node Q is maintained at a high level, the first pull-down node potential pull-down module 12 pulls down the potential of the first pull-down node QB1 to the first low level VGL1, the second pull-down node potential pull-down module 13 pulls down the potential of the second pull-down node QB2 to the first low level VGL1, the first input clock switch CLKIN1 (n), the second input clock switch CLKIN2 (n) and the third input clock switch CLKIN3 (n) are turned on, the first input clock signal, the second input clock signal and the third input clock signal are at a high level, the first row scanning signal output end GO_S1 (n) outputs a high level, the output level pull-down control end G_VDD outputs a high level, the output level pull-down module 184 controls the output level end GO_ELVDD (n) to output the second low level VGL2, the second row scanning signal pull-down control end G_S2 to output a high level, and the second row scanning signal pull-down module 194 controls the second row scanning signal output end GO_S2 (n) to output the second low level VGL2.

At the fourth stage P4, the start signal is at a low level, the first control clock signal is at a high level, the second control clock signal is at a low level, the pull-up node potential pull-down module 102 pulls down the potential of the pull-up node Q to the first low level VGL1, the second control clock switch CLKB is turned on so as to pull up the potential of the second pull-down node QB2 to a high level, the first pull-down node potential pull-down module 12 pulls down the potential of the first pull-down node QB1 to the first low level VGL1, the first input clock switch CLKIN1 (n), the second input clock switch CLKIN2 (n) and the third input clock switch CLKIN3 (n) are turned off, the first row scanning signal pull-down module 172 pulls down the potential of the first row scanning signal to the second low level VGL2, the output level pull-down control module 183 controls the output level pull-down control end G_VDD to output the second low level VGL2, the output level pull-up module 182 controls the output level end to output the high level VDD, the second row scanning signal pull-down control module 193 controls the second row scanning signal pull-down control end G_S2 to output the second low level VGL2, and the second row scanning signal pull-up module 192 pulls up the potential of the second row scanning signal to the high level VDD.

As shown in FIG. 5, the operation sequences at a fifth stage P5, a sixth stage P6, a seventh stage P7 and an eighth stage P8 are identical to those at the first stage P1, the second stage P2, the third stage P3 and the fourth stage P4, respectively.

In FIG. 5, GO_S1 (n+1), GO_S2 (n+1) and GO_ELVDD (n+1) represent a signal outputted by the first row scanning signal output end of the $(n+1)^{th}$-level gate driver circuit, a signal outputted by the second row scanning signal output end thereof, and a signal outputted by the output level end thereof, respectively.

The gate driver circuit of the present disclosure may be applied to an OLED display device or an LTPS display device.

The present disclosure further provides a display device including the above-mentioned gate driver circuit. The display device may be an OLED or LTPS display device.

The present disclosure further provides an electronic product including the above-mentioned display device. The structure and the operational principle of the display device included in the electronic product are identical to those mentioned in the above embodiments, and they will not be repeated herein. In addition, the structures of the other components of the electronic product may refer to those mentioned in the prior art, and they will not be particularly defined herein. The electronic product may be any product or member having a display function, such as household appliance, communication facility, engineering facility and electronic entertainment product.

The above are merely the preferred embodiments of the present disclosure. It should be noted that, a person skilled in the art may make further improvements and modifications without departing from the principle of the present disclosure, and these improvements and modifications shall also fall within the scope of the present disclosure.

What is claimed is:

1. A gate driver circuit, connected to a row of pixel units, each pixel unit includes a pixel driving module and a light-emitting device connected to each other, the pixel driving module comprising a driving transistor, a driving module and a compensating module, the compensating module being connected to a first row scanning signal, and the driving module being connected to a second row scanning signal and a driving voltage, wherein the gate driver circuit further comprises a row pixel controlling unit configured to provide the first row scanning signal to the compensating module and provide the second row scanning signal and the driving voltage to the driving module, so as to control the compensating module to compensate for a threshold voltage of the driving transistor and control the driving module to drive the light-emitting device, wherein:

the row pixel controlling unit comprises a start signal input end, a first control clock input end, a second control clock input end, a reset signal input end, a first input clock end, a second input clock end, a third input clock end, a carry signal output end, a cut-off control signal output end, an output level end, an output level pull-down control end, a first row scanning signal output end, a second row scanning signal output end, and a second row scanning signal pull-down control end, the row pixel controlling unit further comprises:
a pull-up node potential pull-up module configured to pull up a potential of a pull-up node to a high level when a first control clock signal and a start signal are at a high level;
a storage capacitor connected between the pull-up node and the carry signal output end;
a pull-up node potential pull-down module configured to pull down the potential of the pull-up mode to a first low level when a potential of a first pull-down node or a second pull-down node is a high level;
a first control clock switch configured to enable the first control clock input end to be electrically connected to the first pull-down node when the first control clock signal is at a high level;
a second control clock switch configured to enable the second control clock input end to be electrically connected to the second pull-down node when a second control clock signal is at a high level;
a first pull-down node potential pull-down module configured to pull down the potential of the first pull-down node to the first low level when the potential of the pull-up node or the second pull-down node is a high level;
a second pull-down node potential pull-down module connected to the reset signal input end and configured to pull down the potential of the second pull-down node to the first low level when the potential of the pull-up node or the first pull-down node is a high level;
a carry control module configured to enable the carry signal output end to be electrically connected to a second clock signal input end when the potential of the pull-up node is a high level;
a carry signal pull-down module configured to pull down a potential of a carry signal to the first low level when the potential of the first pull-down node or the second pull-down node is a high level;
a cut-off control module configured to enable the second clock signal input end to be electrically connected to the cut-off control signal output end when the potential of the pull-up node is a high level, and enable the cut-off control signal output end to be electrically connected to a second low level output end when the potential of the first pull-down node or the second pull-down node is a high level;
a feedback module configured to transmit a cut-off control signal to the pull-up node potential pull-up module and the pull-up node potential pull-down module when the carry signal is at a high level;
a first input clock switch configured to enable the first input clock end to be electrically connected to the first row scanning signal output end when the potential of the pull-up node is a high level;
a second input clock switch configured to enable the second input clock end to be electrically connected to the output level pull-down control end when the potential of the pull-up node is a high level;
a third input clock switch configured to enable the third input clock end to be electrically connected to the second row scanning signal pull-down control end when the potential of the pull-up node is a high level;
a first row scanning signal pull-down module configured to pull down a potential of the first row scanning signal to a second low level when the potential of the first pull-down node or the second pull-down node is a high level;
an output level pull-down control module configured to pull down a potential of the output level pull-down control end to the second low level when the potential of the first pull-down node or the second pull-down node is a high level;
an output level pull-up module configured to pull up an output level to a high level when the output level pull-down control end outputs the second low level;
an output level pull-down module configured to pull down the output level to the second low level when the output level pull-down control end outputs a high level;
a second row scanning signal pull-down control module configured to pull down a potential of the second row scanning signal pull-down control end to the second low level when the potential of the first pull-down node or the second pull-down node is a high level;
a second row scanning signal pull-up module configured to pull up a potential of the second scanning signal to a high level when the second row scanning signal pull-down control end outputs a high level; and a second row scanning signal pull-down module configured to pull down the potential of the second row scanning signal to the second low level when the second row scanning signal pull-down control end outputs a high level.

2. The gate driver circuit according to claim 1, wherein the pull-up node potential pull-up module comprises:

a first pull-up node potential pull-up transistor, a gate electrode of the first pull-up node potential pull-up transistor is connected to a first electrode of the first pull-up node potential pull-up transistor and the start signal input end, and a second electrode of the first pull-up node potential pull-up transistor is connected to the feedback module; and a second pull-up node potential pull-up transistor, a gate electrode of the second pull-up node potential pull-up transistor is connected to the first control clock input end, a first electrode of the second pull-up node potential pull-up transistor is connected to the second electrode of the first pull-up node potential pull-up transistor, and a second electrode of the second pull-up node potential pull-up transistor is connected to the pull-up node, the pull-up node potential pull-down module comprises:

a first pull-up node potential pull-down transistor, a gate electrode of the first pull-up node potential pull-down transistor is connected to the first pull-down node, a first electrode of the first pull-up node potential pull-down transistor is connected to the pull-up node, and a second electrode of the first pull-up node potential pull-down transistor is connected to the feedback module;

a second pull-up node potential pull-down transistor, a gate electrode of the second pull-up node potential pull-down transistor is connected to the first pull-down node, a first electrode of the second pull-up node potential pull-down transistor is connected to the second electrode of the first pull-up node potential pull-down transistor, and a second electrode of the second pull-up node potential pull-down transistor is connected to the first low level;

a third pull-up node potential pull-down transistor, a gate electrode of the third pull-up node potential pull-down transistor is connected to the second pull-down node, a first electrode of the third pull-up node potential pull-down transistor is connected to the pull-up node, and a second electrode of the third pull-up node potential pull-down transistor is connected to the feedback module; and a fourth pull-up node potential pull-down transistor, a gate electrode of the fourth pull-up node potential pull-down transistor is connected to the second pull-down node, a first electrode of the fourth pull-up node potential pull-down transistor is connected to the second electrode of the third pull-up node potential pull-down transistor, and a second electrode of the fourth pull-up node potential pull-down transistor is connected to the first low level, the first pull-down node potential pull-down module comprises:

a first pull-down transistor, a gate electrode of the first pull-down transistor is connected to the pull-down node, a first electrode of the first pull-down transistor is connected to the first pull-down node, and a second electrode of the first pull-down transistor is connected to the reset signal input end;

a second pull-down transistor, a gate electrode of the second pull-down transistor is connected to the pull-up node, a first electrode of the second pull-down transistor is connected to the second electrode of the first pull-down transistor, and a second electrode of the second pull-down transistor is connected to the first low level; and a third pull-down transistor, a gate electrode of the third pull-down transistor is connected to the second pull-down node, a first electrode of the third pull-down transistor is connected to the first pull-down node, and a second electrode of the third pull-down transistor is connected to the first low level, and the second pull-down node potential pull-down module comprises:

a fourth pull-down transistor, a gate electrode of the fourth pull-down transistor is connected to the pull-up node, a first electrode of the fourth pull-down transistor is connected to the second pull-down node, and a second electrode of the fourth pull-down transistor is connected to the reset signal input end;

a fifth pull-down transistor, a gate electrode of the fifth pull-down transistor is connected to the pull-up node, a first electrode of the fifth pull-down transistor is connected to the second electrode of the fourth pull-down transistor, and a second electrode of the fifth pull-down transistor is connected to the first low level; and a sixth pull-down transistor, a gate electrode of the sixth pull-down transistor is connected to the first pull-down node, a first electrode of the sixth pull-down transistor is connected to the second pull-down node, and a second electrode of the sixth pull-down transistor is connected to the first low level.

3. The gate driver circuit according to claim 2, wherein the carry control module comprises:

a carry control transistor, a gate electrode of the carry control transistor is connected to the pull-up node, a first electrode of the carry control transistor is connected to the second control clock input end, and a second electrode of the carry control transistor is connected to the carry signal output end, the carry signal pull-down module comprises:

a first carry signal pull-down transistor, a gate electrode of the first carry signal pull-down transistor is connected to the first pull-down node, a first electrode of the first carry signal pull-down transistor is connected to the carry signal output end, and a second electrode of the first carry signal pull-down transistor is connected to the first low level; and a second carry signal pull-down transistor, a gate electrode of the second carry signal pull-down transistor is connected to the second pull-down node, a first electrode of the second carry signal pull-down transistor is connected to the carry signal output end, and a second electrode of the second carry signal pull-down transistor is connected to the first low level, the cut-off control module comprises:

a first cut-off control transistor, a gate electrode of the first cut-off control transistor is connected to the pull-up node, a first electrode of the first cut-off control transistor is connected to the second control clock input end, and a second electrode of the first cut-off control transistor is connected to the cut-off control signal output end;

a second cut-off control transistor, a gate electrode of the second cut-off control transistor is connected to the first pull-down node, a first electrode of the second cut-off control transistor is connected to the cut-off control signal output end, and a second electrode of the second cut-off control transistor is connected to the first low level; and a third cut-off control transistor, a gate electrode of the third cut-off control transistor is connected to the second pull-down node, a first electrode of the third cut-off control transistor is connected to the cut-off control signal output end, and a second electrode of the third cut-off control transistor is connected to the first low level, and the feedback module comprises:

a feedback transistor, a gate electrode of the feedback transistor is connected to the carry signal output end, a first electrode of the feedback transistor is connected to the second electrode of the first pull-up node potential pull-up transistor, and a second electrode of the feedback transistor is connected to the cut-off control signal output end.

4. The gate driver circuit according to claim 3, wherein the first row scanning signal pull-down module comprises:

a first output pull-down transistor, a gate electrode of the first output pull-down transistor is connected to the first pull-down node, a first electrode of the first output pull-down transistor is connected to the first row scanning signal output end, and a second electrode of the first output pull-down transistor is connected to the second low level; and a second output pull-down transistor, a gate electrode of the second output pull-down transistor is connected to the second pull-down node, a first electrode of the second output pull-down transistor is connected to the first row scanning signal output end, and a second electrode of the second output pull-down transistor is connected to the second low level, the output level pull-up module comprises:

an output level pull-up transistor, a gate electrode and a first electrode of the output level pull-up transistor are connected to a high level, and a second electrode of the output level pull-up transistor is connected to the output level end, the output level pull-down control module comprises:

a first pull-down control transistor, a gate electrode of the first pull-down control transistor is connected to the first pull-down node, a first electrode of the first pull-down control transistor is connected to the output level pull-down control end, and a second electrode of the first pull-down control transistor is connected to the second low level; and a second pull-down control transistor, a gate electrode of the second pull-down control transistor is connected to the second pull-down node, a first electrode of the second pull-down control transistor is connected to the output level pull-down control end, and a second electrode of the second pull-down control transistor is connected to the second low level, the output level pull-down module comprises:

an output level pull-down transistor, a gate electrode of the output level pull-down transistor is connected to the output level pull-down control end, a first electrode of the output level pull-down transistor is connected to the output level end, and a second electrode of the output level pull-down transistor is connected to the second low level, the second row scanning signal pull-up module comprises:

a row scanning pull-up transistor, a gate electrode and a first electrode of the row scanning pull-up transistor is connected to a high level, and a second electrode of the row scanning pull-up transistor is connected to the second row scanning signal output end, the second row scanning signal pull-down control module comprises:

a third pull-down control transistor, a gate electrode of the third pull-down control transistor is connected to the first pull-down node, a first electrode of the third pull-down control transistor is connected to the second row scanning signal pull-down control end, and a second electrode of the third pull-down control transistor is connected to the second low level; and a fourth pull-down control transistor, a gate electrode of the fourth pull-down control transistor is connected to the second pull-down node, a first electrode of the fourth pull-down control transistor is connected to the second row scanning signal pull-down control end, and a second electrode of the fourth pull-down control transistor is connected to the second low level, and the second row scanning signal pull-down module comprises:

a third output pull-down transistor, a gate electrode of the third output pull-down transistor is connected to the row scanning signal pull-down control end, a first electrode of the third output pull-down transistor is connected to the second row scanning signal output end, and a second electrode of the third output pull-down transistor is connected to the second low level.

5. The gate driver circuit according to claim 1, wherein the first control clock signal is complementary to the second control clock signal.

6. A gate driving method for use in the gate driver circuit according to claim 1 comprising the steps of:

at a first stage, setting a start signal to be at a low level, setting a first control clock signal to be at a low level, setting the second control clock signal to be at a high level, pulling up, by a second control clock switch, a potential of a second pull-down node to a high level, pulling down, by a pull-up node potential pull-down module, a potential of a pull-up node to a first low level, pulling down, by the first pull-down node potential pull-down module, the potential of the first pull-down node to the first low level, controlling, by an output level pull-up module, an output level end to output a high level, controlling, by a first row scanning signal pull-down module, a first row scanning signal output end to output a second low level, and controlling, by a second row scanning signal pull-up module, a second row scanning signal output end to output a high level;

at a second stage, setting the start signal to be at a high level, setting the first control clock signal to be at a high level, setting the second control clock signal to be at a low level, pulling up, by the pull-up node potential pull-up module, the potential of the pull-up node to a high level, pulling down, by the first pull-down node potential pull-down module, the potential of the first pull-down node to the first low level, pulling down, by a second pull-down node potential pull-down module, a potential of a second pull-down node to the first low level, turning on a first input clock switch, a second input clock signal and a third input clock switch, setting a first input clock signal, a second input clock signal and a third input clock signal to be at a low level, and maintaining signals from an output level end, a first row scanning signal output end and a second row scanning signal output end to be unchanged;

at a third stage, setting the start signal to be at a low level, setting the first control clock signal to be at a low level, setting the second control clock signal to be at a high level, maintaining the potential of the pull-up node to be at a high level, pulling down, by the first pull-down node potential pull-down module, the potential of the first pull-down node to the first low level, pulling down, by the second pull-down node potential pull-down module, the potential of the second pull-down node to the first low level, turning on the first input clock switch, the second input clock switch and the third input clock switch, setting the first input clock signal, the second input clock signal and the third input clock signal to be at a high level, outputting a high level by the first row scanning signal output end, outputting a high level by an output level pull-down control end, controlling, by an output level pull-down module, the output level end to output the second low level, outputting a high level by the second row scanning signal pull-down control end, and controlling, by the second row scanning signal pull-down module, the second row scanning signal output end to output the second low level; and at a fourth stage, setting the start signal to be at a low level, setting the first control clock signal to be at a high level, setting the second control clock signal to be at a low level, pulling down, by the pull-up node potential pull-down module, the potential of the pull-up node to the first low level, turning on the second control clock switch so as to pull up the potential of the second pull-down node to a high level, pulling down, by the first pull-down node potential pull-down module, the potential of the first pull-down node to the first low level, turning off the first input clock switch, the second input clock switch and the third input clock switch, pulling down, by the first row scanning signal pull-down module, the potential of the first row scanning signal to the second low level, controlling, by the output level pull-down control module, the output level pull-down control end to output the second low level, controlling, by the output level pull-up module, the output level end to output a high level, controlling, by the second row scanning signal pull-down control module, the second row scanning signal pull-down control end to output the second low level, and pulling up, by the second row scanning signal pull-up module, the potential of the second row scanning signal to a high level.

7. A gate-on-array circuit, comprising multiple levels of the gate driver circuit according to claim 1, wherein apart from a first-level gate driver circuit, a cut-off control signal output end of each level of gate driver circuit is connected to a reset signal input end of a previous level of the gate driver circuit, and apart from a last-level gate driver circuit, a carry signal output end of each level of gate driver circuit is connected to a start signal input end of a next level of gate driver circuit.

8. The gate-on-array circuit according to claim 7, wherein a first input clock signal, a second input clock signal and a third input clock signal inputted to an $(n+1)^{th}$-level gate driver circuit are complementary to a first input clock signal, a second input clock signal and a third input clock signal inputted to an $n^{th}$-level gate driver circuit, respectively, wherein n is an integer greater than or equal to 1, and n+1 is less than or equal to the number of levels of the gate driver circuits included in the gate-on-array circuit.

9. A display device comprising the gate driver circuit according to claim 1.

10. The display device according to claim 9, wherein the display device is an organic light-emitting diode (OLED) display device or a low temperature poly-silicon (LTPS) display device.

11. An electronic product comprising the display device according claim 9.

12. The gate driver circuit according to claim 2, wherein the first control clock signal is complementary to the second control clock signal.

13. The gate driver circuit according to claim 3, wherein the first control clock signal is complementary to the second control clock signal.

14. The gate driver circuit according to claim 4, wherein the first control clock signal is complementary to the second control clock signal.

15. The display device according to claim 9, wherein the pull-up node potential pull-up module comprises:
a first pull-up node potential pull-up transistor, a gate electrode of the first pull-up node potential pull-up transistor is connected to a first electrode of the first pull-up node potential pull-up transistor and the start signal input end, and a second electrode of the first pull-up node potential pull-up transistor is connected to the feedback module; and
a second pull-up node potential pull-up transistor, a gate electrode of the second pull-up node potential pull-up transistor is connected to the first control clock input end, a first electrode of the second pull-up node potential pull-up transistor is connected to the second electrode of the first pull-up node potential pull-up transistor, and a second electrode of the second pull-up node potential pull-up transistor is connected to the pull-up node, the pull-up node potential pull-down module comprises:
a first pull-up node potential pull-down transistor, a gate electrode of the first pull-up node potential pull-down transistor is connected to the first pull-down node, a first electrode of the first pull-up node potential pull-down transistor is connected to the pull-up node, and a second electrode of the first pull-up node potential pull-down transistor is connected to the feedback module;
a second pull-up node potential pull-down transistor, a gate electrode of the second pull-up node potential pull-down transistor is connected to the first pull-down node, a first electrode of the second pull-up node potential pull-down transistor is connected to the second electrode of the first pull-up node potential pull-down transistor, and a second electrode of the second pull-up node potential pull-down transistor is connected to the first low level;
a third pull-up node potential pull-down transistor, a gate electrode of the third pull-up node potential pull-down transistor is connected to the second pull-down node, a first electrode of the third pull-up node potential pull-down transistor is connected to the pull-up node, and a second electrode of the third pull-up node potential pull-down transistor is connected to the feedback module; and a fourth pull-up node potential pull-down transistor, a gate electrode of the fourth pull-up node potential pull-down transistor is connected to the second pull-down node, a first electrode of the fourth pull-up node potential pull-down transistor is connected to the second electrode of the third pull-up node potential pull-down transistor, and a second electrode of the fourth pull-up node potential pull-down transistor is connected to the first low level, the first pull-down node potential pull-down module comprises:

a first pull-down transistor, a gate electrode of the first pull-down transistor is connected to the pull-down node, a first electrode of the first pull-down transistor is connected to the first pull-down node, and a second electrode of the first pull-down transistor is connected to the reset signal input end;

a second pull-down transistor, a gate electrode of the second pull-down transistor is connected to the pull-up node, a first electrode of the second pull-down transistor is connected to the second electrode of the first pull-down transistor, and a second electrode of the second pull-down transistor is connected to the first low level; and a third pull-down transistor, a gate electrode of the third pull-down transistor is connected to the second pull-down node, a first electrode of the third pull-down transistor is connected to the first pull-down node, and a second electrode of the third pull-down transistor is connected to the first low level, and the second pull-down node potential pull-down module comprises:

a fourth pull-down transistor, a gate electrode of the fourth pull-down transistor is connected to the pull-up node, a first electrode of the fourth pull-down transistor is connected to the second pull-down node, and a second electrode of the fourth pull-down transistor is connected to the reset signal input end;

a fifth pull-down transistor, a gate electrode of the fifth pull-down transistor is connected to the pull-up node, a first electrode of the fifth pull-down transistor is connected to the second electrode of the fourth pull-down transistor, and a second electrode of the fifth pull-down transistor is connected to the first low level; and a sixth pull-down transistor, a gate electrode of the sixth pull-down transistor is connected to the first pull-down node, a first electrode of the sixth pull-down transistor is connected to the second pull-down node, and a second electrode of the sixth pull-down transistor is connected to the first low level.

16. The display device according to claim 15, wherein the carry control module comprises:

a carry control transistor, a gate electrode of the carry control transistor is connected to the pull-up node, a first electrode of the carry control transistor is connected to the second control clock input end, and a second electrode of the carry control transistor is connected to the carry signal output end, the carry signal pull-down module comprises:

a first carry signal pull-down transistor, a gate electrode of the first carry signal pull-down transistor is connected to the first pull-down node, a first electrode of the first carry signal pull-down transistor is connected to the carry signal output end, and a second electrode of the first carry signal pull-down transistor is connected to the first low level; and a second carry signal pull-down transistor, a gate electrode of the second carry signal pull-down transistor is connected to the second pull-down node, a first electrode of the second carry signal pull-down transistor is connected to the carry signal output end, and a second electrode of the second carry signal pull-down transistor is connected to the first low level, the cut-off control module comprises:

a first cut-off control transistor, a gate electrode of the first cut-off control transistor is connected to the pull-up node, a first electrode of the first cut-off control transistor is connected to the second control clock input end, and a second electrode of the first cut-off control transistor is connected to the cut-off control signal output end;

a second cut-off control transistor, a gate electrode of the second cut-off control transistor is connected to the first pull-down node, a first electrode of the second cut-off control transistor is connected to the cut-off control signal output end, and a second electrode of the second cut-off control transistor is connected to the first low level; and a third cut-off control transistor, a gate electrode of the third cut-off control transistor is connected to the second pull-down node, a first electrode of the third cut-off control transistor is connected to the cut-off control signal output end, and a second electrode of the third cut-off control transistor is connected to the first low level, and the feedback module comprises:

a feedback transistor, a gate electrode of the feedback transistor is connected to the carry signal output end, a first electrode of the feedback transistor is connected to the second electrode of the first pull-up node potential pull-up transistor, and a second electrode of the feedback transistor is connected to the cut-off control signal output end.

17. The display device according to claim 16, wherein the first row scanning signal pull-down module comprises:

a first output pull-down transistor, a gate electrode of the first output pull-down transistor is connected to the first pull-down node, a first electrode of the first output pull-down transistor is connected to the first row scanning signal output end, and a second electrode of the first output pull-down transistor is connected to the second low level; and a second output pull-down transistor, a gate electrode of the second output pull-down transistor is connected to the second pull-down node, a first electrode of the second output pull-down transistor is connected to the first row scanning signal output end, and a second electrode of the second output pull-down transistor is connected to the second low level, the output level pull-up module comprises:

an output level pull-up transistor, a gate electrode and a first electrode of the output level pull-up transistor are connected to a high level, and a second electrode of the output level pull-up transistor is connected to the output level end, the output level pull-down control module comprises:

a first pull-down control transistor, a gate electrode of the first pull-down control transistor is connected to the first pull-down node, a first electrode of the first pull-down control transistor is connected to the output level pull-down control end, and a second electrode of the first pull-down control transistor is connected to the second low level; and a second pull-down control transistor, a gate electrode of the second pull-down control transistor is connected to the second pull-down node, a first electrode of the second pull-down control transistor is connected to the output level pull-down control end, and a second electrode of the second pull-down control transistor is connected to the second low level, the output level pull-down module comprises:

an output level pull-down transistor, a gate electrode of the output level pull-down transistor is connected to the output level pull-down control end, a first electrode of the output level pull-down transistor is connected to the output level end, and a second electrode of the output level pull-down transistor is connected to the second low level, the second row scanning signal pull-up module comprises:

a row scanning pull-up transistor, a gate electrode and a first electrode of the row scanning pull-up transistor is connected to a high level, and a second electrode of the row scanning pull-up transistor is connected to the second row scanning signal output end, the second row scanning signal pull-down control module comprises:

a third pull-down control transistor, a gate electrode of the third pull-down control transistor is connected to the first pull-down node, a first electrode of the third pull-down control transistor is connected to the second row scanning signal pull-down control end, and a second electrode of the third pull-down control transistor is connected to the second low level; and a fourth pull-down control transistor, a gate electrode of the fourth pull-down control transistor is connected to the second pull-down node, a first electrode of the fourth pull-down control transistor is connected to the second row scanning signal pull-down control end, and a second electrode of the fourth pull-down control transistor is connected to the second low level, and the second row scanning signal pull-down module comprises:

a third output pull-down transistor, a gate electrode of the third output pull-down transistor is connected to the row scanning signal pull-down control end, a first electrode of the third output pull-down transistor is connected to the second row scanning signal output end, and a second electrode of the third output pull-down transistor is connected to the second low level.

18. The display device according to claim 9, wherein the first control clock signal is complementary to the second control clock signal.

* * * * *